US007791273B2

(12) United States Patent
Kabay et al.

(10) Patent No.: US 7,791,273 B2
(45) Date of Patent: Sep. 7, 2010

(54) ELECTROLUMINESCENT LIGHT EMITTING DEVICE

(75) Inventors: Gabriella H. Kabay, Eaglemont (AU); Ernest Kabay, Eaglemon (AU)

(73) Assignee: Kabay & Company Pty Ltd., Eltham (AU)

( * ) Notice: Subject to any disclaimer, the term of this patent is extended or adjusted under 35 U.S.C. 154(b) by 198 days.

(21) Appl. No.: 12/036,044

(22) Filed: Feb. 22, 2008

(65) Prior Publication Data

US 2008/0218076 A1 Sep. 11, 2008

Related U.S. Application Data

(62) Division of application No. 10/519,363, filed as application No. PCT/AU03/00838 on Jun. 30, 2003, now Pat. No. 7,354,785.

(30) Foreign Application Priority Data

Jun. 28, 2002 (AU) .................................... PS3270

(51) Int. Cl.
*H01L 51/00* (2006.01)

(52) U.S. Cl. ...................................... 313/509; 313/506

(58) Field of Classification Search ......... 313/498–512; 428/690
See application file for complete search history.

(56) References Cited

U.S. PATENT DOCUMENTS

| | | | | |
|---|---|---|---|---|
| 4,593,228 | A | 6/1986 | Albrechtson et al. | |
| 4,792,500 | A * | 12/1988 | Kojima | 428/690 |
| 4,794,302 | A | 12/1988 | Nire et al. | |
| 5,643,496 | A | 7/1997 | Brese et al. | |
| 6,225,740 | B1 | 5/2001 | Tucker et al. | |
| 6,225,741 | B1 * | 5/2001 | Nakamura et al. | 313/506 |
| 6,433,487 | B1 * | 8/2002 | Yamazaki | 315/169.3 |
| 6,558,820 | B2 | 5/2003 | Raychaudhuri et al. | |
| 6,621,212 | B1 | 9/2003 | Pennaz et al. | |
| 6,835,112 | B2 | 12/2004 | Tanabe et al. | |
| 6,960,725 | B2 | 11/2005 | Zhengkai et al. | |
| 7,238,535 | B2 | 7/2007 | Brower et al. | |
| 7,261,838 | B2 | 8/2007 | Belinski-Wolfe et al. | |
| 2002/0190636 | A1 | 12/2002 | Coglan et al. | |
| 2002/0195931 | A1 | 12/2002 | George et al. | |

FOREIGN PATENT DOCUMENTS

| | | | |
|---|---|---|---|
| GB | 1158924 | A | 7/1969 |
| JP | 05-003079 | A | 1/1993 |
| JP | 3-192689 | | 8/1999 |
| JP | 11-214158 | A | 8/1999 |
| JP | 2001-085153 | A | 3/2001 |
| WO | WO 02/058438 | A2 | 7/2002 |
| WO | WO 02/058438 | A3 | 7/2002 |

* cited by examiner

*Primary Examiner*—Nimeshkumar D Patel
*Assistant Examiner*—Anne M Hines
(74) *Attorney, Agent, or Firm*—Sughrue Mion, PLLC

(57) ABSTRACT

An electroluminescent device having a light emitting layer (25) containing phosphor particles (31, 32), wherein the phosphor particles protrude from the light emitting layer to cause the surrounding layers to conform to the protrusions, thus increasing the performance of the lamp. Methods of constructing a lamp using a temperature above the softening temperature of the insulating layer of the device are also disclosed.

12 Claims, 15 Drawing Sheets

ELECTROLUMINESCENT LIGHT EMITTING DEVICE

This application is a divisional of U.S. application Ser. No. 10/519,363 filed Aug. 10, 2005, which is a 371 National Stage Application of PCT/AU2003/000838 filed Jun. 30, 2003, which claims priority from Australian Application No. PS 3270/02 filed Jun. 28, 2002, the disclosures of which are incorporated herein by reference.

FIELD OF THE INVENTION

The present invention relates to a thick film electroluminescent light emitting device and method of construction.

RELATED APPLICATION

This application claims priority from Australian Provisional Patent Application No. PS3270, the contents of which are wholly incorporated by reference.

BACKGROUND OF THE INVENTION

The present invention relates to a thick film inorganic electroluminescent lamp and method of construction thereof.

Electroluminescent lamps have a number of performance parameters, including brightness, efficiency and life. While any one parameter can be increased, for example brightness, other parameters must usually be reduced, such as lamp life or efficiency.

Electroluminescent lamps are constructed as a lossy capacitor, generally having a dielectric material between two electrodes. A light-emitting layer having phosphor particles is also located between the electrodes, either within the dielectric layer or as a separate layer between the electrodes. Typically one of the electrodes is transparent to allow light generated by the light emitting layer to escape, and thus the lamp emits light. The transparent electrode is typically a material such as indium tin oxide.

To manufacture an electroluminescent lamp, each of the layers may be provided in the form of an ink. The inks, which may be applied by screen printing or roll coating include a binder, a solvent, and a filler, wherein the filler determines the nature of the printed layer.

A typical solvent is dimethylacetamide (DMAC) or ethylbutylacetate (EB acetate). The binder may be a fluoropolymer such as polyvinylidene fluoride/hexafluoropropylene (PVDF/HFP), polyester, vinyl, epoxy or Kynar 9301, a proprietary terpolymer sold by Atofina, dissolved in N,N Dimethylacetamide. Other binders used include ShinEtsu's CR—S (with or without Cr—U) dissolved in N,N dimethylformamide.

The light emitting layer is typically screen printed from a slurry containing a solvent, a binder, and zinc sulphide phosphor particles. A dielectric layer is typically screen printed from a slurry containing a solvent, a binder, and barium titanate (BaTiO.sub.3) particles. A rear (opaque) electrode may be screen printed from a slurry containing a solvent, a binder, and conductive particles such as silver or carbon.

When such a lamp is used in portable electronic devices, automotive displays, and other applications where the power source is a low voltage battery, power needs to be provided by an inverter that converts low voltage, direct current into high voltage, alternating current. In order for a lamp to glow sufficiently, a peak-to-peak voltage in excess of about one hundred and twenty volts is usually necessary. The actual voltage depends on the construction of the lamp and, in particular, the field strength within the phosphor particles. The frequency of the alternating current through an electroluminescent lamp affects the life of the lamp, with frequencies between 200 hertz and 1000 hertz being preferred. Ionic migration occurs in the phosphor at frequencies below 200 hertz, leading to premature failure. Above 1000 hertz, the life of the phosphor is inversely proportional to frequency.

SUMMARY OF THE INVENTION

The present invention provides an electroluminescent lamp having phosphor particles which protrude from a light emitting layer, and an electrode layer which conforms to the protrusions.

In another aspect there is provided a thick film electroluminescent light emitting device having a plurality of layers including: a first electrode layer, a light emitting layer having phosphor particles causing protrusions in the light emitting layer, and at least one other layer including a second electrode layer wherein the first electrode layer and the at least one other layer conform to the protrusions in the light emitting layer.

In another aspect there is provided a method of construction of an electroluminescent lamp by applying an insulating layer to an electrode layer, then providing a light emitting layer including phosphor particles in a binder matrix, the proportion of phosphor particles in the binder matrix being sufficient such that when solidified, a proportion of the phosphor particles cause protrusions in the light emitting layer. A light emitting layer is applied to the insulating layer, and insulating layer is then heated above its softening temperature to cause the phosphor particles to move into the insulating layer. The second electrode can be applied either before or after the high temperature heat treatment step. This method causes the front electrode to conform to protrusions in the light emitting layer, and for the insulating layer to conform to protrusions in the light emitting layer, providing a lamp with improved characteristics.

BRIEF DESCRIPTION OF THE DRAWINGS

FIG. 1(*b*) shows a schematic representation of electric field lines through a parallel plate capacitor;

DESCRIPTION OF THE PREFERRED EMBODIMENT

Figure 1A:
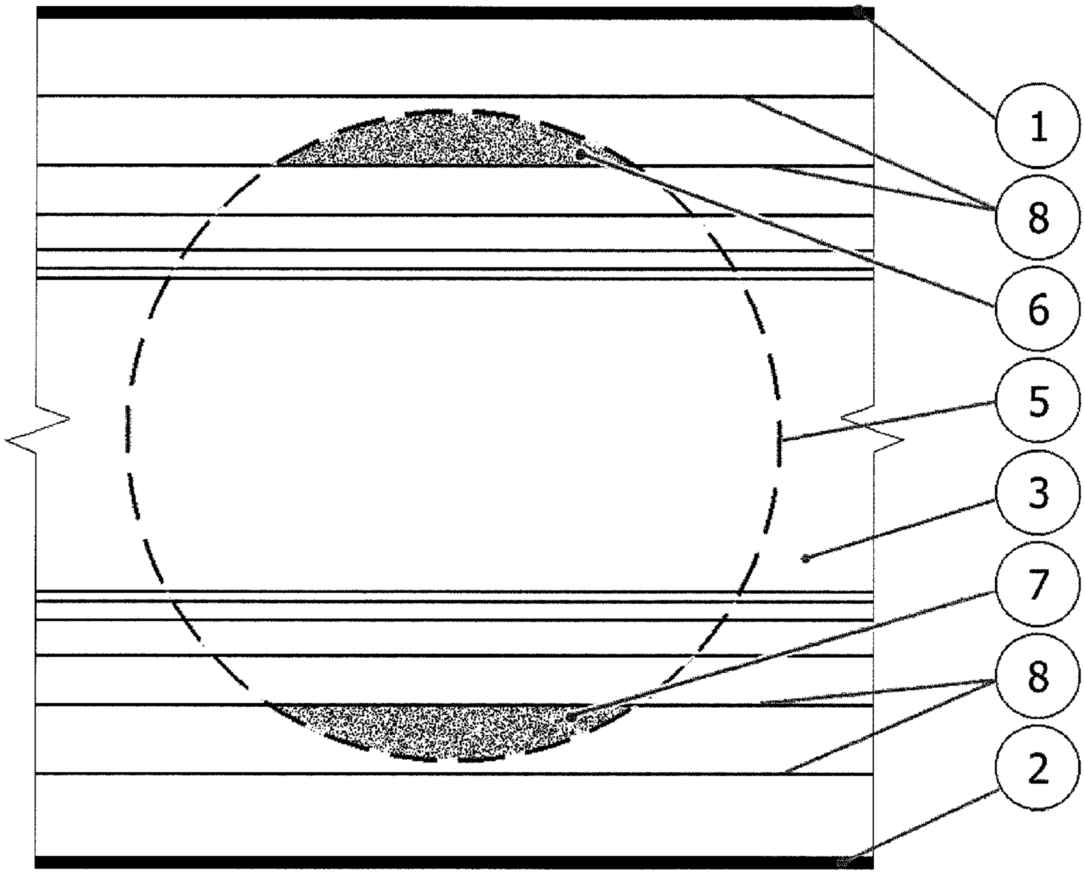
FIG. 1(*a*) shows a schematic representations of a parallel plate capacitor generating an electric field.
Figure 1B:
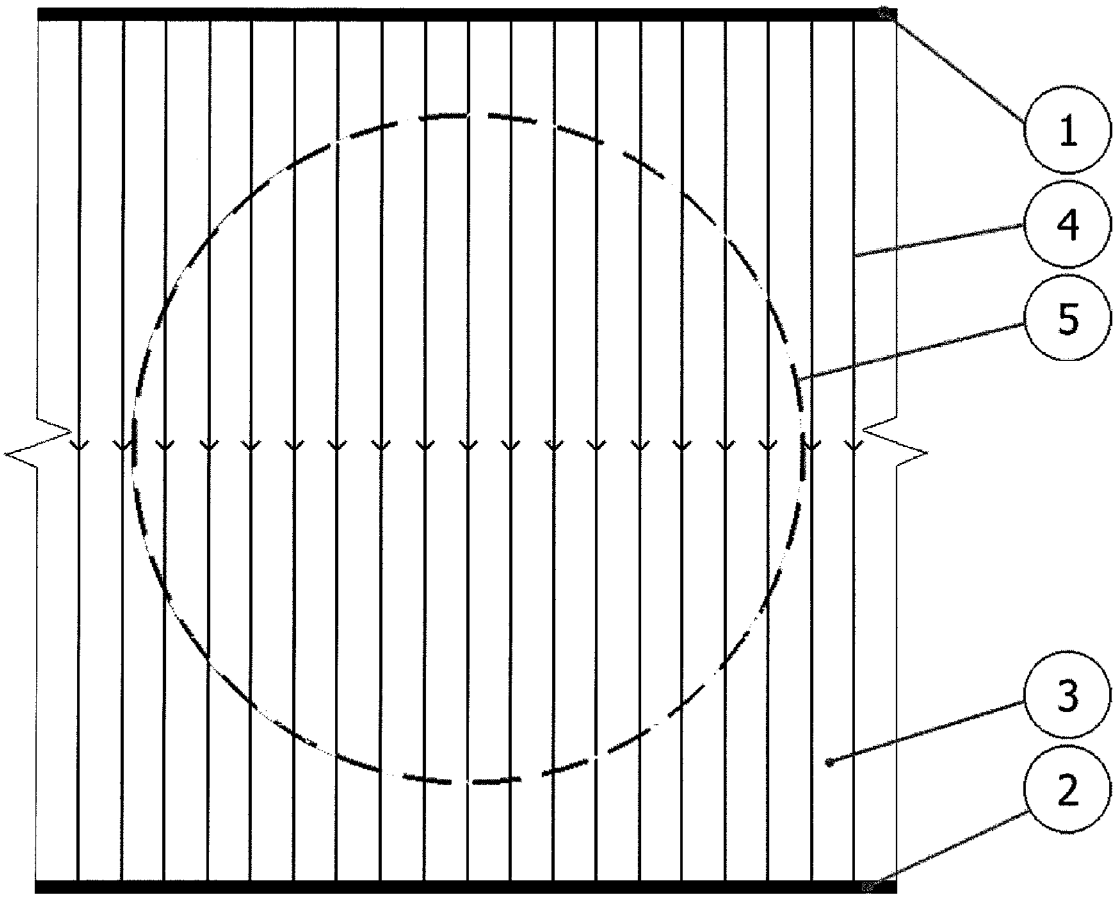

In FIG. 1(*a*) a schematic of a parallel plate capacitor is shown where an electrode 1 and interface 2 are on either side of a dielectric material 3. When a voltage is applied across the electrode 1 and interface 2, an electric field 4, as shown in FIG. 1(*b*) is generated through the dielectric material 3. If a sphere 5 is defined within the dielectric material 3, it can be seen that sphere surfaces 6 and 7 are closest to the electrode 1 and interface 2.

Equipotential voltage lines 8 show areas of equal voltage within the sphere 5, and the closer the dielectric is to the electrode 1 or interface 2, the higher the voltage experienced by the dielectric material 3. These sphere surfaces 6 and 7 will be exposed to the highest voltage, and are also closest to being perpendicular to the parallel plates.

Figure 2A:
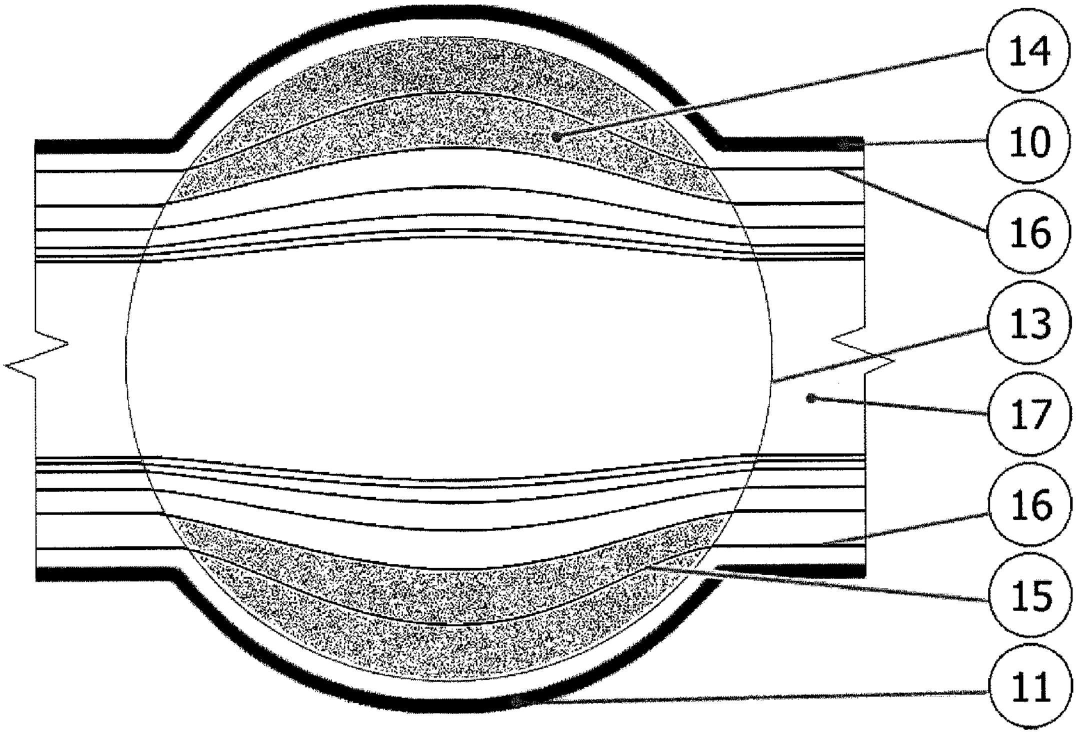
FIG. 2(*a*) and FIG. 2(*b*) show schematic representations of an embodiment of an electroluminescent unit cell of the present invention.
Figure 2B:
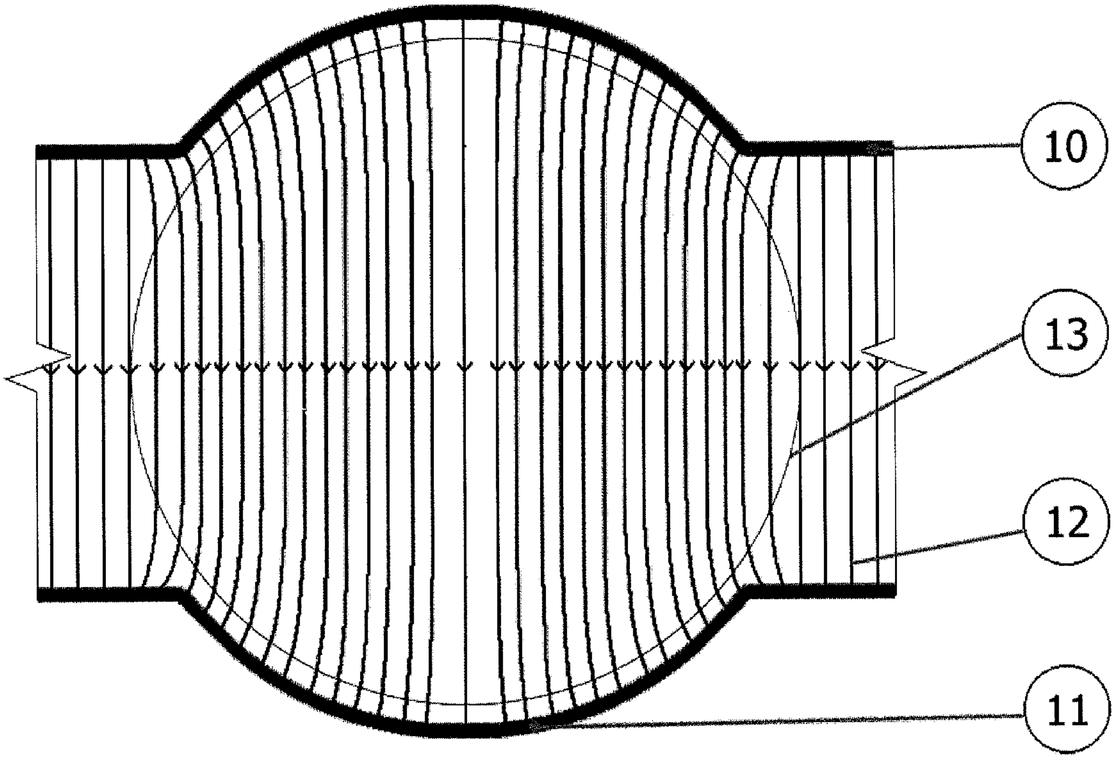
Figure 3A:
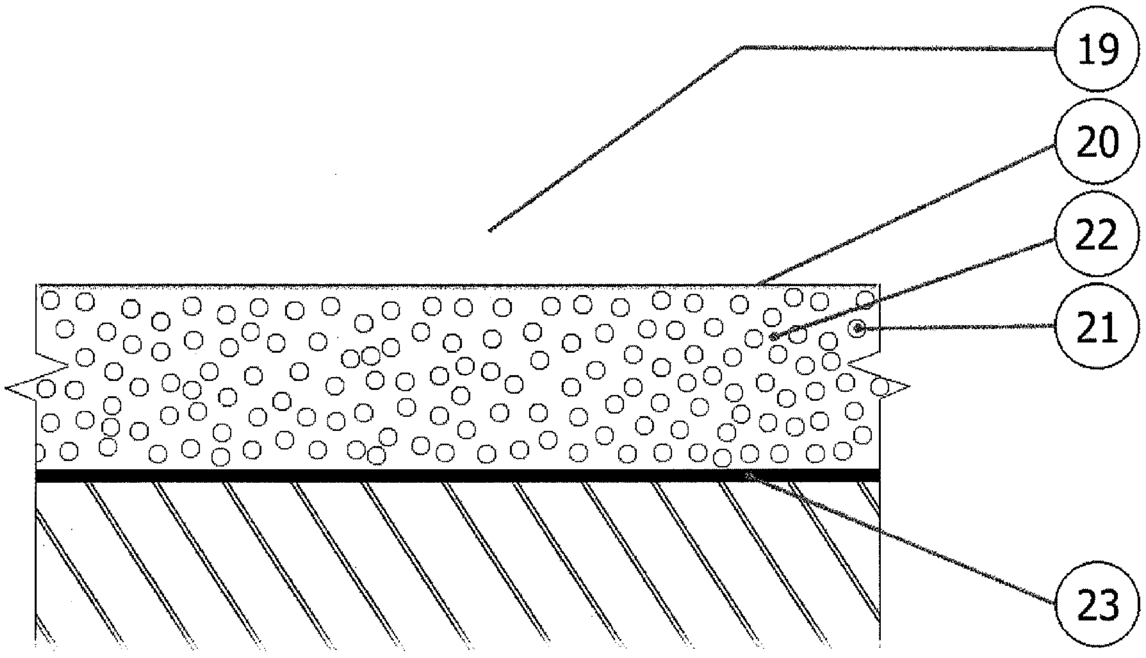
FIG. 3(*a*) to (*h*) show stages construction of an embodiment of an electroluminescent lamp of the present invention.
Figure 3B:
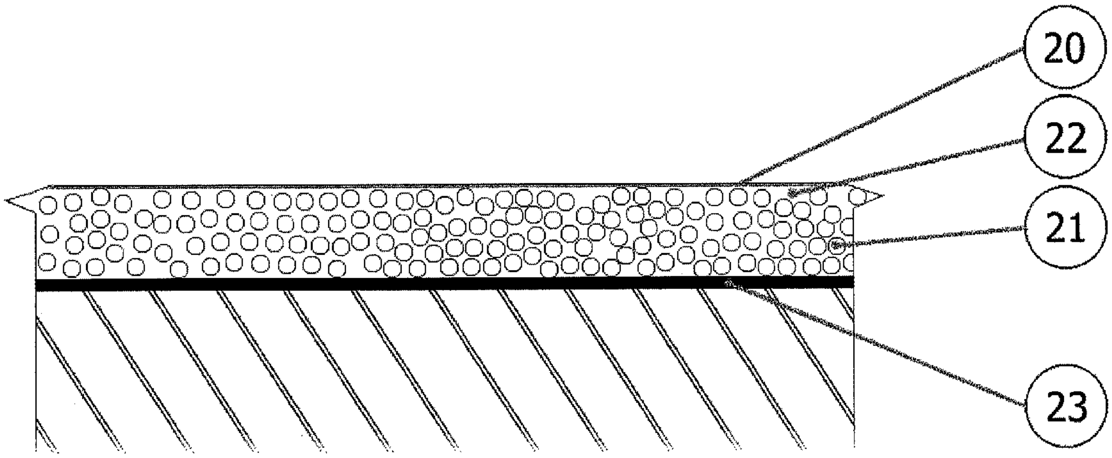
Figure 3C:
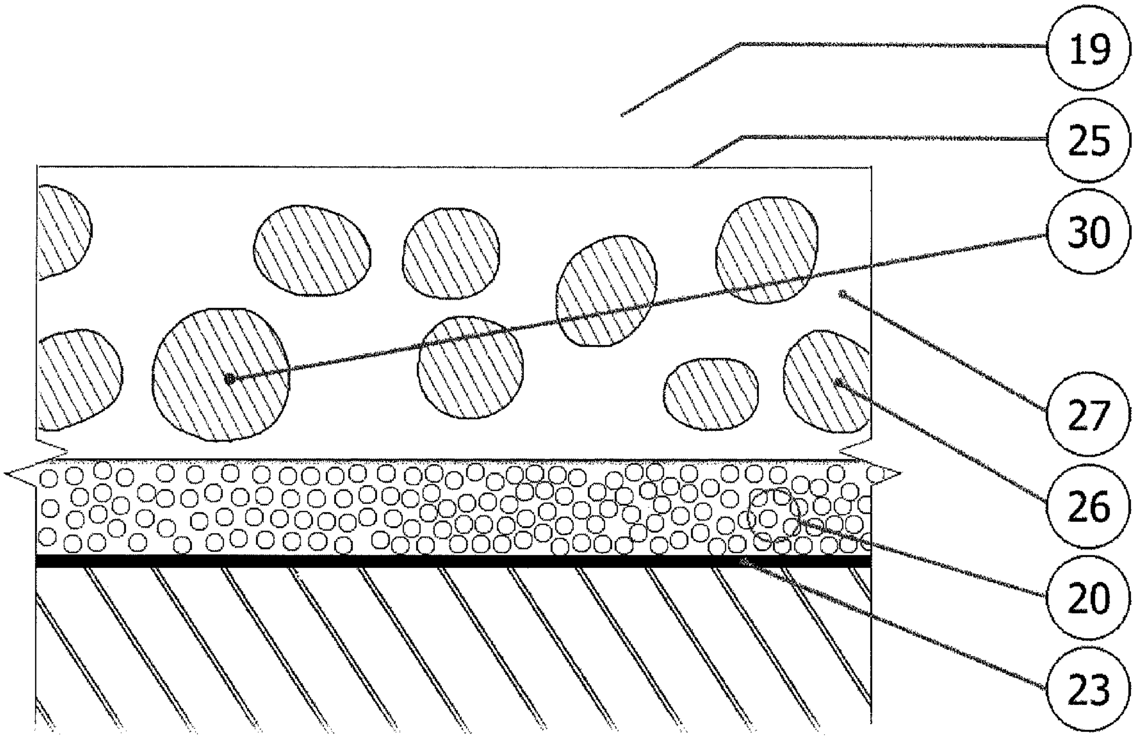
Figure 3D:
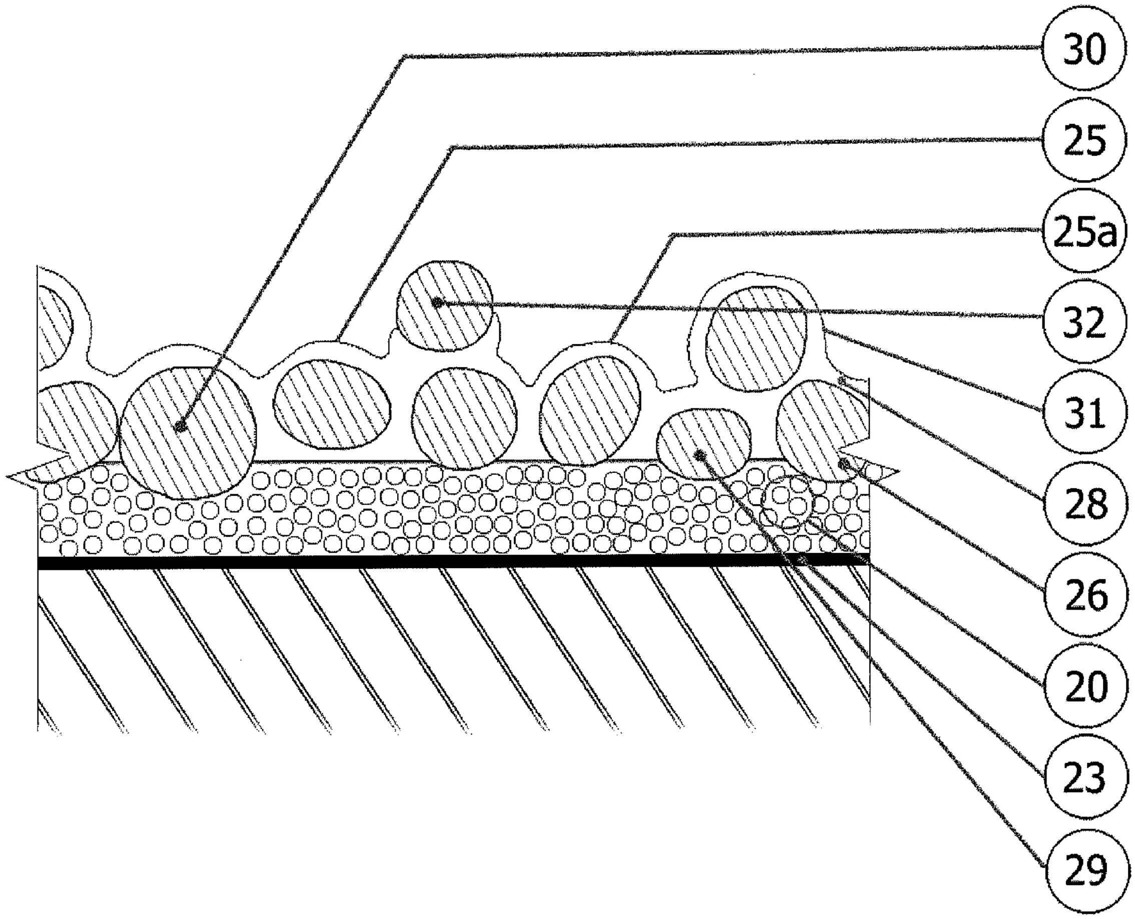
Figure 3E:
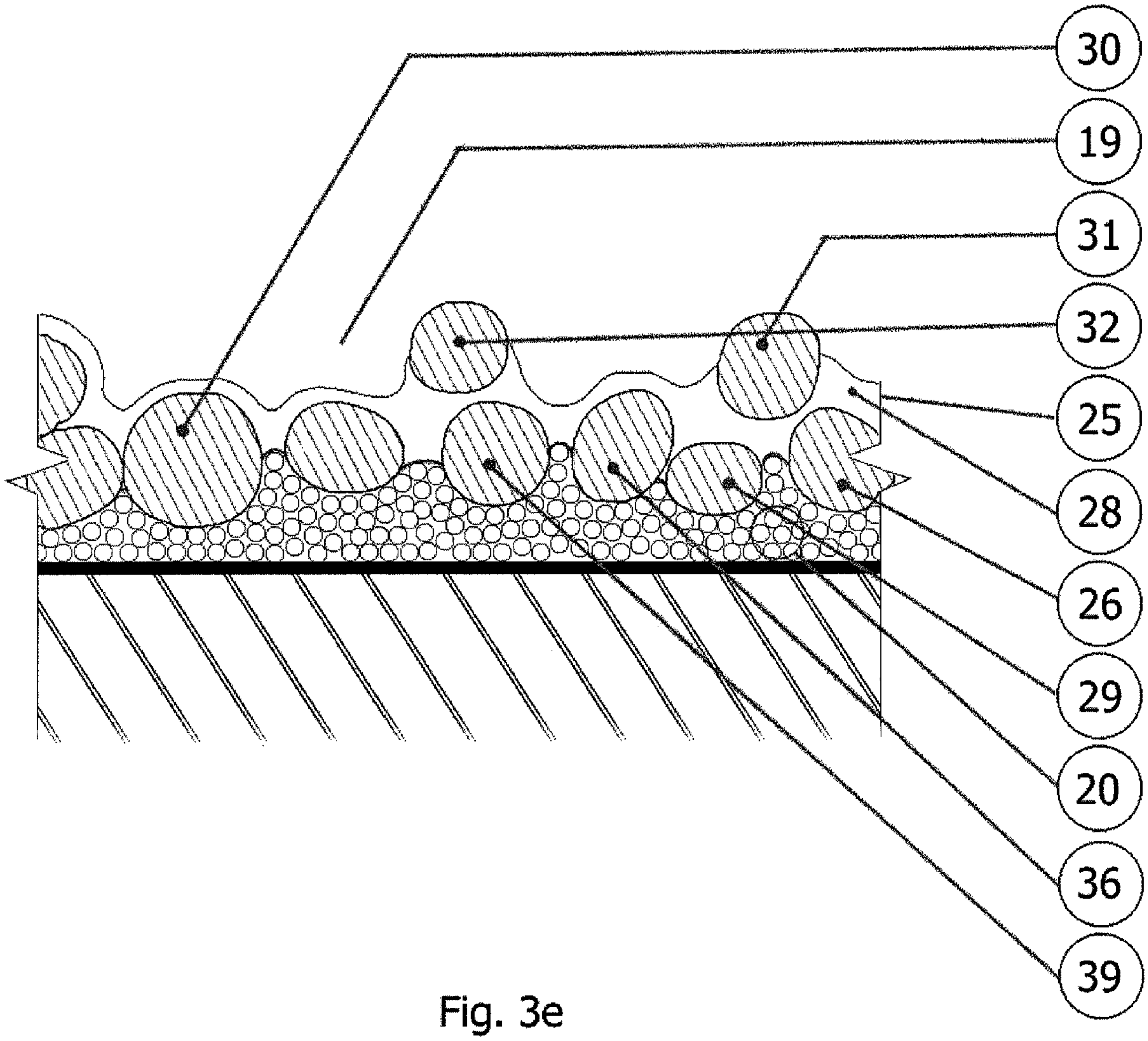
Figure 3F:
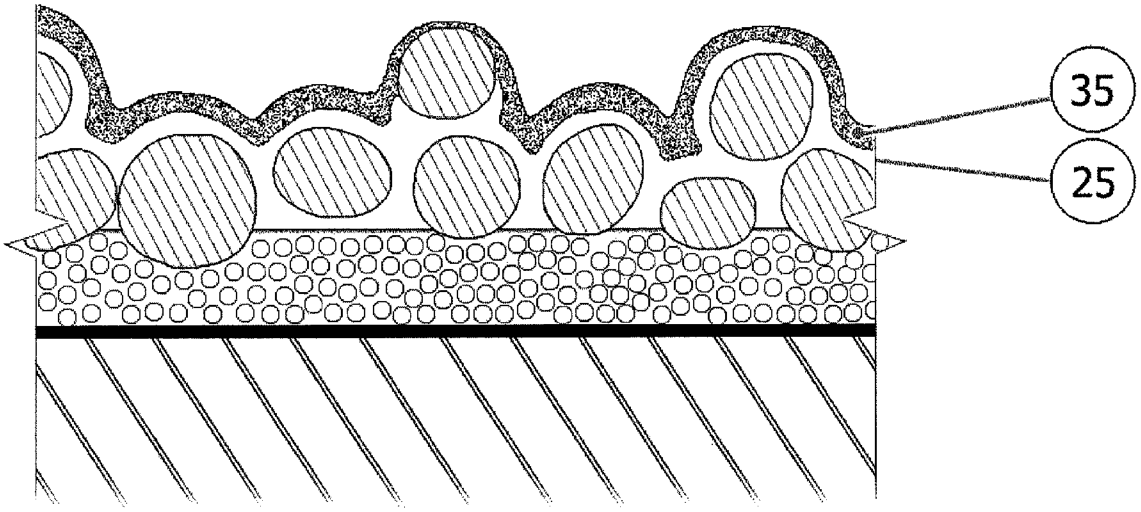
Figure 3G:
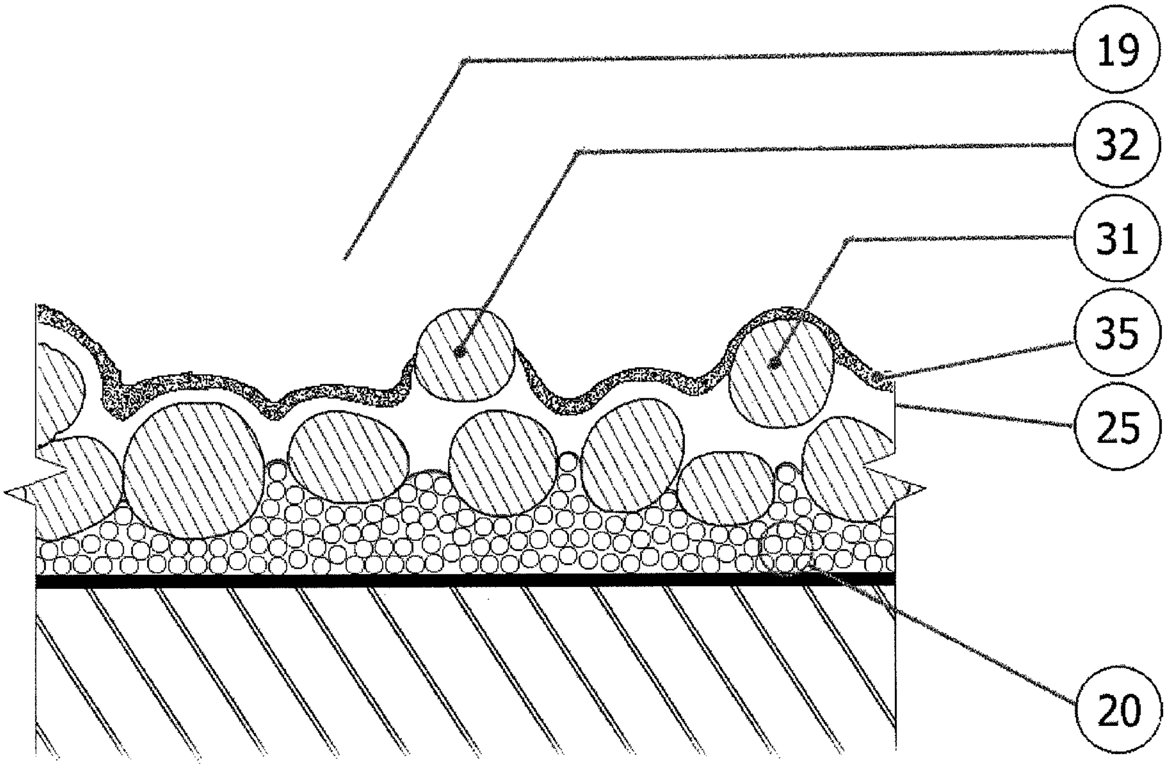
Figure 3H:
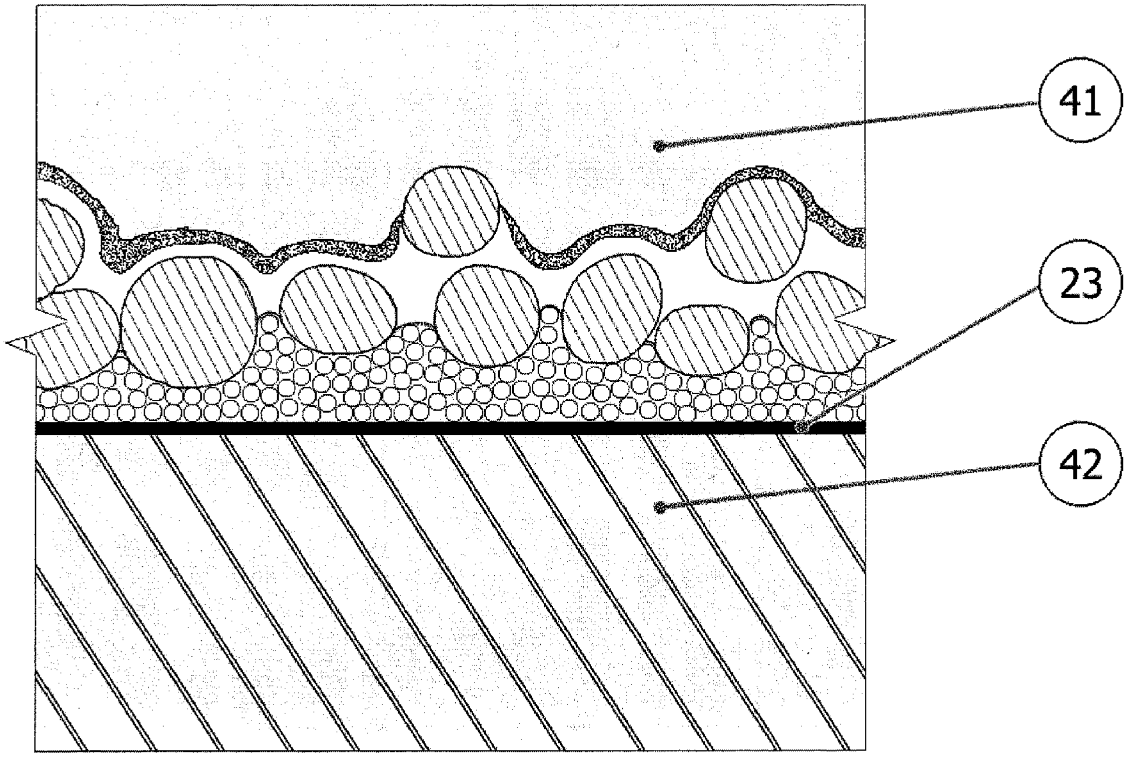

In FIG. 2(*a*), an electrode 10 and interface 11 are on either side of a dielectric material 17. When a voltage is applied across the electrode 10 and interface 11, an electric field 12, as seen in FIG. 2(*b*) is generated. If a sphere 13 is defined within the dielectric material, it can be seen that sphere surfaces 14 and 15 are closer to the electrode 10 and interface 11, as compared to the sphere surfaces 6 and 7, as the electrode 10 and interface 11 are in close and conforming relation to the surface of the sphere 13.

Equipotential voltage lines 16 show where the surfaces of the sphere are exposed to the highest voltage. It can be seen that the sphere surfaces 14 and 15 are larger than the sphere surfaces 6 and 7 of a parallel plate capacitor in FIG. 1(*a*). Further, the electric field 12 is more perpendicular to the surface of the sphere when the electrode 10 and interface 11 conform to the surface of the sphere. Further, the sphere surfaces 6 and 7 are exposed to more of the highest voltage.

The present invention utilises the principle of applying a conformal electrode or interface to a sphere, where the sphere is a phosphor particle or particles, to produce an electroluminescent light emitting device or lamp.

FIG. 3(*a*) to (*h*) are schematic diagrams showing steps in the preparation of an embodiment of such an electroluminescent lamp of the present invention.

In FIG. 3(*a*), a first step is shown, whereupon a wet insulating layer 20 is applied as an ink containing ferroelectric particles 21 and a polymer-solvent composition 22. The layer 20 is applied to a back electrode 23 forming a substrate 19. The back electrode 23 may be a thin layer of reflective aluminium foil, or any other known type of electrode suitable for use in electroluminescent lamps. For example, back electrode 23 may be a heat stabilised polyester film on which a conductive medium such as carbon or silver has been deposited. Typical examples of materials used in electrodes include Du Pont's Melinex 506 as substrate (or backing), with Du Pont's 9145 silver as a conductive layer.

With regard to the polymer solvent composition, ShinEtsu's CR—S (with or without Cr—U) dissolved in N,N dimethylformamide has been found to be suitable for one or more of the layers in the electroluminescent lamp of the present invention. Another suitable polymer-solvent combination is Atofina's Kynar 9301 (vinylidene fluoride) in N,N Dimethylacetamide. A range of polymer solvent compositions may be suitable for use with the present invention.

The ferroelectric particles 21 may be Titanium Dioxide or Barium Titanate, and for example may make up between 35-70% in the layer 20, or when wet or from 70% to 90% of the total composition by weight in the layer 20 when dried.

In order to dry the insulating layer 20 a relatively low temperature drying process may be used, such that most of the solvent evaporates, leaving a "touch dry" resin with ferroelectric particles suspended therein. The temperatures used depend on the length of curing time, and are, for example, 80 degrees Celsius if a short curing time of 10 minutes is desired, up to in excess of half an hour if 25 degrees Celsius is used. Conditions such as ventilation will also affect the drying time. The upper surface of the insulating layer 20 is typically smooth at this point, as shown in FIG. 3(*b*). After drying, the volume of the insulating layer is reduced by the amount of solvent that evaporates, and this reduced volume after drying can be seen in FIG. 3(*b*) when compared to FIG. 3(*a*).

After drying the thickness of the insulating layer 20 may be between 10-30 microns. The insulating layer 20 should be thick enough so that phosphor particles can sink into the insulating layer 20 so that the insulating layer 20 conforms to the shape of the phosphor particles. As shown in FIG. 3(*c*), the next layer or ink to be applied is the light emitting layer 25, which comprises phosphor particles 26 suspended in a wet binder 27 such as a polymer solvent solution, as described above. The light emitting layer 25 can be made with the previously described polymer solvent composition, from high dielectric CR—S to low dielectric fluoropolymer, depending on the requirements for the finished lamp.

It has been found that a wide variety of coated or uncoated phosphors generally suitable for electroluminescent lamps are suitable for the present lamp and construction method. Other additives used in light emitting layers of prior art may be included as required, such as dies, stabilisers, etc. The phosphor particles 26 may be a range of sizes, from 10 microns to 100 microns, however particularly goods results are achieved if the particles are generally around the 20-40 micron range in diameter. The present electroluminescent lamp and methodology do not require the particles to be of uniform size, and traditional sources of phosphors may be used.

It has been found that the present invention works well with both coated and uncoated phosphor particles, and therefore it is possible to use phosphor particles within the light emitting layer that already have an environmental coating. (Osram Sylvania 729, 723, GG43, GG23, Durel 1PHS001AA, 1PHS002AA).

The thickness of the layer 25 can vary, depending on a number of factors including the phosphor particle size, and it is not necessary to have a thick layer of resin coating the phosphor particles. The light emitting ink may be deposited in one or more passes.

FIG. 3(*c*) shows the phosphor particles 26 suspended in the wet polymer solvent composition 27, and arranged in a generally random fashion. The phosphor ink of the light emitting layer 25 can be deposited in one or in multiple layers by screen printing, bar coating, or a variety of film applicators.

An example of a technique for laying down the light emitting layer is as follows. The ink is made from CR—S 10% and CR-u 1.1%, DMF 33.3%, and GG43 55.55% by weight. This was applied by film applicator (Bird Applicator from Braive Instruments) technique to the insulating layer in a wet thickness of approximately 80-110 microns. After application, the substrates are removed from the printer and dried.

FIG. 3(*d*) shows the light emitting layer after low temperature drying, where the majority of the solvent has evaporated, leaving a reduced volume dry binder 28. During the deposition and low temperature drying of the light emitting layer 25, the insulating layer 20 also softens somewhat and phosphor particles may begin to sink partially into the layer 20, as shown by the particles 26, 29 and 30. In this case the solvent chosen for the light emitting layer 25 is also a solvent for the insulating layer 20, thus producing a chemical softening of the insulating layer 20 during application of the light emitting layer 25. The solvents used in the light emitting layer 25 and insulating layer 20 may be the same. The top surface 25*a* of the light emitting layer 25 is also uneven after the initial low temperature drying. In some cases individual particles 32 may protrude from the upper surface of the light emitting layer, to the extent that they are not covered by the polymer solvent composition.

The extent of the unevenness of the light emitting layer after low temperature drying is determined by several factors, including the amount of phosphor particles to resin. In a light emitting layer having one or one and a half layers of phosphor particles, the higher the percentage of phosphor particles to resin, the more protrusions that will occur.

In the present example, the preferred amount of dry binder to phosphor particles is in the range from approximately 25% binder to 75% phosphor (by dry weight), to approximately 5% binder to 95% phosphor particles (by dry weight). Benefits have been seen in ranges from approximately 50% binder to 50% phosphor and above. Increasing the phosphor ratio in the light emitting layer is also one way of increasing light output from a lamp. As phosphor particles are generally more expensive than the binder, increasing the phosphor ratio will also increase the cost of a lamp, and therefore the actual ratio used will be determined by the required light output and cost of the lamp. Increasing the ratio of phosphor to dry binder affects the handling properties of the ink, however this can be balanced by increasing the amount of solvent in the polymer solvent composition to compensate.

The phosphor particles protrude into the insulating layer, which softens due either to temperature effects (described below) or chemical softening of the solvent from the light emitting layer, or both. In examples of lamps produced by the present method, the surface loading of the phosphor layer was 4.2 to 8.8 grams per $cm^2$, however there is no set limit on the surface loading.

FIG. 3(*e*) shows the substrate 19 after a high temperature heat treatment stage before the application of the transparent electrode layer 35 (shown in FIG. 3(*g*)). The heat treatment should be to a sufficient temperature so that the binder(s) are softened to allow particle movement within each ink. That is, the phosphor particles must be able to move in the light emitting layer 25 and also into the insulating layer 20, as shown in FIG. 3(*e*). Phosphor particles are denser than the binder in either layer 20 or 25, and therefore tend to sink into the insulating layer 20. The method of application may also push the phosphor particles into the insulating layer 20.

Several differences can be seen between FIGS. 3(*d*) and 3(*e*) due to the high temperature heat treatment step. In FIG. 3(*e*) more phosphor particles protrude into the insulating layer 20. Further, the degree of protrusion has increased into the insulating layer 20. This can be seen by the placement of particles 26,29,30,36 and 39. Also, the binder 28 of the light emitting layer 25 has flowed such that some of the phosphor particles represented by particle 31 are now exposed where once they were covered.

During the high temperature heat treatment the phosphor particles move to form a more close packed arrangement.

The upper surface of the light emitting layer after the high temperature heat treatment is generally smoother than before the application of the high temperature heat treatment stage.

It should be noted that it is not necessary for the particles to protrude from both sides of the light emitting layer. While particles 30 and 36 protrude from both sides, and show improved light output compared to prior art, particles 26, 29 and 32 protrude only from one side of the light emitting layer but are believed to still show an improved result. Further, while a single layer of particles can enable the particles to protrude from both sides of the light emitting layer, arrangements such as particle 32 arranged over particles 39, also show improved results, and allow more close packing of phosphor particles within the light emitting layer. Packing arrangements of particles found to work include a single layer of phosphor particles in the light emitting layer (for example phosphor particle 30); one and one half layers of phosphor particles in the light emitting layer (particles 29 and 31), and two phosphor particles stacked on top of each other within the light emitting layer (particles 32 and 39). It should be recognised that in a single lamp all three arrangements may be found, depending on the way the light emitting layer is laid onto the insulating layer. Best brightness is generally found when a majority or all the phosphor particles are in a single close packed layer. Good brightness with increased efficiency can be found when the phosphor particles are arranged in one and a half layers.

Having two layers, as shown with phosphor particles 32 and 39 still produces benefits over the prior art.

The temperature range for the high temperature treating process is set by the thermal properties of the polymer solvent compositions used in the insulating layer and in the light emitting layer after low temperature drying. For example, cyanoethyl pullulan becomes suitably soft when exposed to a temperature between 160 to 200 Centigrade and 20 minutes. Thus high temperature heat treatment would be in excess of 160 degrees in this case. For this example the temperature for high temperature heat treatment may be 188 degrees Celsius for 22 minutes.

After the high temperature heat treatment stage, the next stage involves application of the electrode layer 35, as shown in FIG. 3(*g*). The electrode layer 35 is applied to the substrate 19 on top of the dried and heat treated light emitting layer 25. While the protrusions from the light emitting layer are significant, they are reduced due to the additional protrusion of the phosphor particles into the insulating layer 20. The electrode layer 35 in this embodiment transmits light, and good results have been achieved with a variety of transparent electrodes used in electroluminescent lamps of the prior art. It is desirable, however, for the electrode to have a degree of flexibility and flowability so that there is substantial coverage of the phosphor particles 31 protruding from the light emitting layer 25. A material found to be suitable for use in this embodiment is Acheson PF 427, and a suitable low temperature drying temperature would be 105 degrees Celsius for about 10 minutes.

Some of the phosphor particles 32 may not be fully covered by the electrode layer, however it has been found that these particles still emit light.

In an alternative method step shown in FIG. 3(*f*), the electrode layer 35 is applied to the light emitting layer 25 before high temperature heat treatment. The whole substrate is then subjected to the high temperature heat treatment, producing a similar structure to that shown in FIG. 3(*g*). During the high temperature heat treatment, the electrode layer 35 dries, while the mechanism for phosphor particles to move within the layers is the same as that described in FIG. 3(*e*) to produce the substrate of FIG. 3(*g*).

A suitable electrode material, for application to the light emitting layer before high temperature heat treatment, is an electrode composed of Ethylhydroxy Ethyl Cellulose binder with Ethyl Toluene and/or Trimethyl Benzene solvent, using Indium Oxide in a proportion of 30-50% wet weight. Such a transparent electrode layer can survive heat treatment of 180 degrees Celsius, as desired in this embodiment.

In FIG. 3(*h*), an environmental protective layer 41 has been added to reduce water penetration of the lamp. A layer such as Aclam TC100 film with or without Nylon 6 as desiccant or UV curable inks such as Acheson PF-455 or Du Pont 5018 may be used. It is known that water penetration is one of the factors that reduce electroluminescent lamp life. Also, the full extent of a back electrode 42 not including a bus bar is shown. The layers shown in FIG. 3(*h*) complete the steps necessary to produce an electroluminescent lamp.

The methods described above are aimed at increasing the conformity of the electrodes and oppositely charged surfaces (generally an insulating layer) to the shape of phosphor particles. It should be recognised that phosphor particles are not necessarily a single homogenous particles, but may be agglomerates of many smaller particles, or formed from several sub-particles to act as a single particle. Further, phosphor particles are not limited to a spherical shape, and given the technology used to manufacture generally available phosphor particles, in many cases they are not spherical. A wide variety of phosphors have been used in experiments applying the methodology and arrangements described herein, and good results were achieved with all the phosphors tried.

Electroluminescent light emitting devices constructed as described above shows increased dynamic capacitance per area, compared to many prior art devices. Typically, prior art devices exhibit capacitance between 300-700 pico-farads/$cm^2$, whereas devices of the present invention commonly exhibit capacitances in the range of 700-1200 pico-farads.per $cm^2$.

The electroluminescent device constructed in accordance with the present invention is not intended to be limited to the method disclosed herein.

Figure 4:
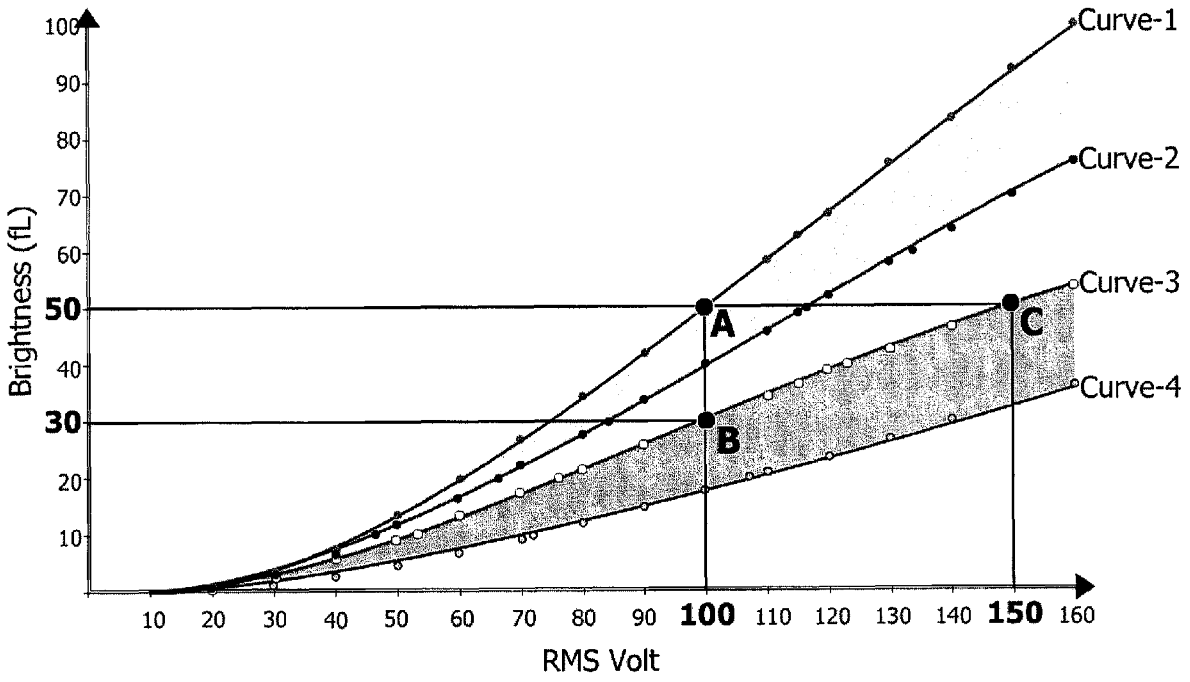
FIGS. 4, 5 and 6 shows examples of performance of an electroluminescent lamp of the present invention.
Figure 5:
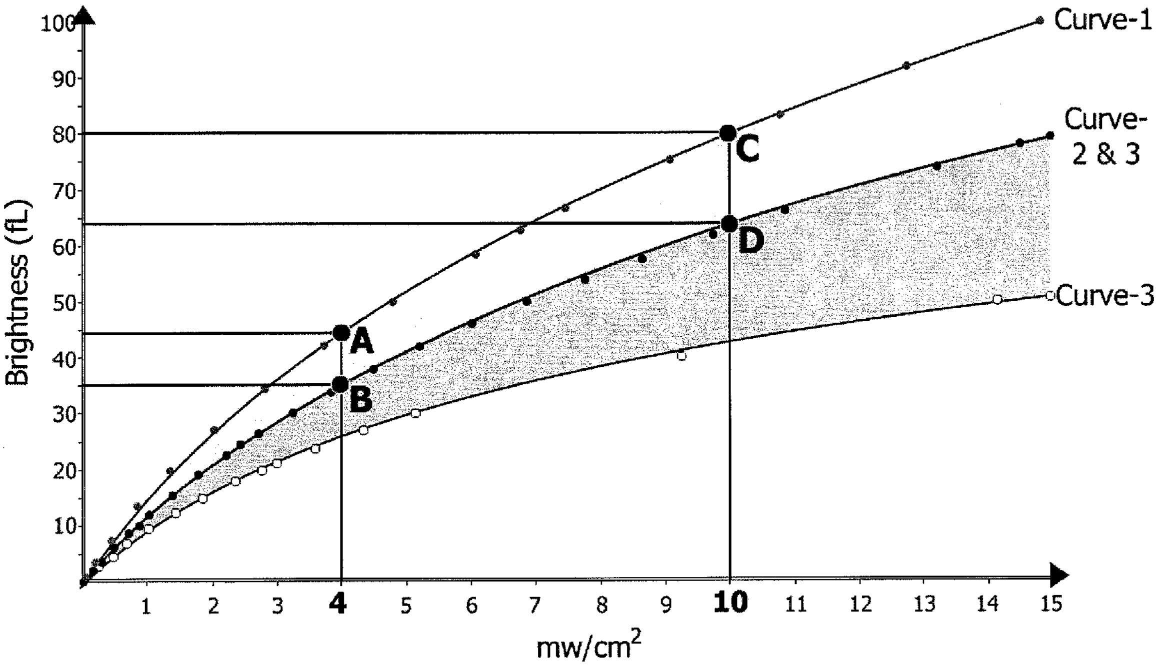
Figure 6:
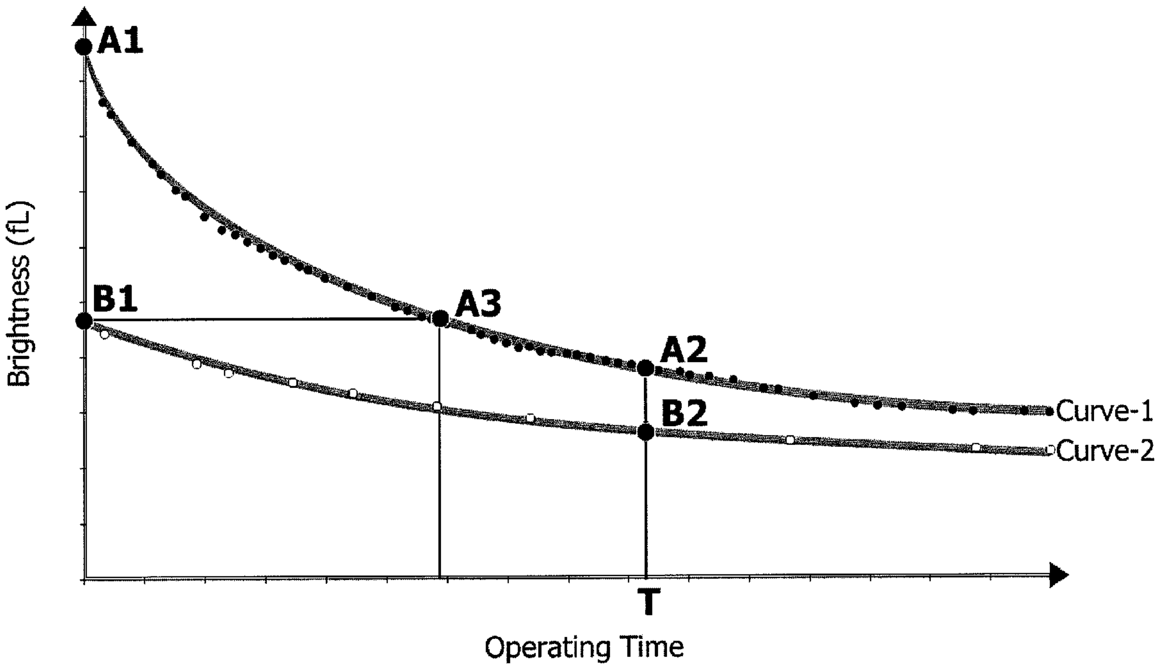

FIGS. 4, 5, and 6 show comparative performance levels of lamps made with the abovementioned techniques, compared to prior art lamps. In the figures, points A,B,C and D are reference points for comparison of lamps of the present invention and the prior art.

FIG. 4 shows the brightness of various lamps at a fixed frequency of 400 Hz. Curve 1 shows some of the best performing lamps from a batch made in accordance with the embodiments described herein. Curve 2 shows a lower level of performance achieved by the lamps. Optimisation of the invention is expected to produce further improvements and the performance data included herein is given as an example of some lamps produced by the methods disclosed herein. Curves 3 and 4 show a typical range of light output from lamps of the prior art. It should be recognised that lamp construction techniques can provide lamps with a wide range of characteristics.

FIG. 5 shows lamps at various power settings, all at 400 Hz. The lamps constructed as described herein show increased brightness versus power consumption compared to prior art lamps.

FIG. 6 shows life characteristics for lamps of the present invention compared to prior art lamps. It is known that the light output from electroluminescent lamps decays over time, depending on several factors such as electrical drive parameters, component materials used, environmental conditions, etc. It can be seen that lamps of the present invention start brighter than prior art lamps in general, and retain their enhanced performance for the life of the lamp.

The prior art lamps tested were lamps that were commercially available at the time of filing the present application. There may be some variation depending on manufacturer and other factors.

The invention claimed is:

1. An alternating current-driven, thick film electroluminescent device, comprising:

a first electrode layer;

an insulating layer, disposed on the first electrode layer, comprising a ferroelectric-polymer dispersion therein;

a light emitting layer, disposed on the insulating layer, comprising a phosphor-polymer dispersion therein; and a transparent second electrode layer, disposed on the light emitting layer;

wherein top and bottom surfaces of the light emitting layer have randomly undulating profiles.

2. The device according to claim 1, wherein the randomly undulating profiles of the top and bottom surfaces of the light emitting layer are formed by the dispersion of phosphor particles in the phosphor-polymer dispersion.

3. The device according to claim 2, wherein the randomly undulating profiles of the top and bottom surfaces provide increased capacitance and brightness.

4. The device according to claim 1, wherein an upper surface of the insulating layer directly contacts the lower, randomly undulating surface of the light emitting layer, and a lower surface of the transparent second electrode layer directly contacts the upper, randomly undulating surface of the light emitting layer.

5. The device according to claim 4, wherein the randomly undulating profiles of the top and bottom surfaces provide increased capacitance and brightness.

6. The device according to claim 1, wherein the randomly undulating profiles of the top and bottom surfaces provide increased capacitance and brightness.

7. The device according to claim 1, wherein the randomly undulating profiles of the top and bottom surfaces provide increased brightness when driven at 9 V and 1 Hz.

8. The device according to one of claim 7, further providing an increased light sum in candela per square meter hour over a predetermined operating period.

9. The device according to claim 1, wherein the randomly undulating profiles of the top and bottom surfaces provide improved efficiency and brightness maintenance.

10. The device according to one of claim 9, further providing an increased light sum in candela per square meter hour over a predetermined operating period.

11. The device according to claim 1, wherein the randomly undulating profiles of the top and bottom surfaces provide a longer operating time at a consistent brightness.

12. The device according to one of claim 11, further providing an increased light sum in candela per square meter hour over a predetermined operating period.

* * * * *

UNITED STATES PATENT AND TRADEMARK OFFICE

CERTIFICATE OF CORRECTION

PATENT NO. : 7,791,273 B2
APPLICATION NO. : 12/036044
DATED : September 7, 2010
INVENTOR(S) : Gabriella H. Kabay and Ernest Kabay It is certified that error appears in the above-identified patent and that said Letters Patent is hereby corrected as shown below:

Col. 8, line 34, delete "9 V and 1 Hz" after "when driven at", insert --100 V and 400 Hz--.

Signed and Sealed this
Eighteenth Day of January, 2011

David J. Kappos

David J. Kappos
*Director of the United States Patent and Trademark Office*